United States Patent [19]

Chen

[11] Patent Number: 5,147,492

[45] Date of Patent: Sep. 15, 1992

[54] METHOD OF BONDING COPPER AND RESIN

[75] Inventor: Chung J. Chen, Taipei, Taiwan

[73] Assignee: Compeq Manufacturing Co., Ltd., Tao Yuan Hsien, Taiwan

[21] Appl. No.: 658,783

[22] Filed: Feb. 20, 1991

[51] Int. Cl.$^5$ ............................................. B32B 31/00
[52] U.S. Cl. .................................... 156/281; 148/269; 148/272; 156/319; 174/259; 252/182.29; 427/343; 427/419.5; 428/623; 428/626; 428/629
[58] Field of Search ................ 156/281, 319; 427/343, 427/419.5; 148/269, 272; 428/623, 629, 626; 252/182.29; 174/259

[56] References Cited

U.S. PATENT DOCUMENTS 4,642,161 2/1987 Akahoshi et al. .................. 156/314
4,902,551 2/1990 Nakaso et al. ..................... 156/281

*Primary Examiner*—John J. Gallagher
*Attorney, Agent, or Firm*—Zarley, McKee, Thomte, Voorhees & Sease

[57] ABSTRACT

A method of bonding copper and resin comprising the steps of:
  a) forming a layer of copper oxide on a surface of copper by oxidation of copper;
  b) reducing the layer of copper oxide thus formed to metallic copper with a reducing solution with the addition of an alkaline solution and a stabilizer at a controlled temperature under a circulated condition within a controlled period of time to modify its morphology; and
  c) forming a layer of copper oxide on a surface of the metallic copper by baking; and
  d) bonding the surface of the copper oxide formed by the baking and a resin together by heat-pressing.

19 Claims, 5 Drawing Sheets

METHOD OF BONDING COPPER AND RESIN

BACKGROUND OF THE INVENTION

The present invention relates to a method of bonding copper and a resin together, and, more particularly, to a method of bonding copper and a resin together with consistently high bonding strength and reduced formation of pink rings and laminate voids on a printed circuit board by treatment of the oxide layer formed between the copper and the resin.

Since no sufficient bonding strength between a metal and a resin can be secured by directly bonding the resin onto the smooth surface of the metal, a known method has heretofore been employed in which an oxide layer is formed on the surface of a metal to improve the bonding strength, as described in "Plating and Surface Finishing" vol. 69, No. 6, pp. 96-99 (June, 1982).

Nowadays, the formation of a layer of copper oxide on an inner surface of copper so as to enhance the bondage between copper and resin has become an inevitable step in the production of printed circuit boards or multilayer printed wiring boards. However, an inherent problem in the method is that copper oxide is readily eroded upon contact with an aqueous acidic solution by becoming copper ions dissolved therein. In addition, the brittle and poor mechanical properties of the oxide layer as well as the tendency of the oxide layer to get wet and contaminated easily have, nevertheless, caused "pink rings" and "laminate voids" on boards thus produced. The formation of pink rings and laminate voids represents serious defects in the boards especially in an era when increasingly high quality and reliability are demanded. These defects have become a bottleneck in the production of multilayer printed wiring boards to pursue further and higher development.

U.S. Pat. No. 4,642,161 discloses a method of bonding copper and a resin together which comprises the steps of forming a copper oxide layer on the surface of copper by oxidation of copper, reducing the copper oxide layer to metallic copper with a reducing solution, and bonding the surface of the metallic copper formed by the reduction and a resin together. However, formaldehyde cannot be used as the reducing solution since the copper oxide layer formed on the surface of copper is hardly reduced to metallic copper with formaldehyde under usual conditions.

Nevertheless, formaldehyde is one of the best reducing agents because it possesses the characteristics of low cost, easy sewage treatment, and high stability.

U.S. Pat. No. 5,006,200 discloses a method of bonding copper and resin which comprises the steps of forming a layer of copper oxide on a surface of copper by oxidation of copper, reducing the layer of copper oxide thus formed to cuprous oxide with a reducing solution, and bonding the surface of the cuprous oxide formed by the reduction and a resin together by heat-pressing.

To enhance the bonding strength between copper and resin, as is well-known, a layer of copper oxide was formed between the copper and resin in the production of printed circuit boards or multilayer printed wiring boards. The formation of the copper oxide is:

a) to act as an interface between the copper and resin to prevent the direct contact of resin with copper which may cause premature aging of the resin; and b) to provide a surface of higher roughness so as to enhance the bonding strength between copper and resin.

However, an oxide layer is very fine in structure and is subjected to contamination by dirt and humidity which cause the formation of "laminate voids". Furthermore, as the oxide layer is easily eroded to dissolve upon contact with an acid, the area where the oxide layer has been eroded reveals the color of the underlying copper which is pink in color and thus causes the formation of the so called "pink rings".

The area where the formation of "laminate voids" and/or "pink rings" occurs indicates that the resin is not in contact with the copper and, thus, that there is poor bondage therebetween. In other words, the greater the number of and the larger the size of the presence of "laminate voids" and/or "pink rings" on the printed circuit board, the lower the quality of the printed circuit board.

Unfortunately, nearly all printed circuit boards with more than four layers suffer from the formation of "laminate voids" and/or "pink rings". Therefore, the reduction in number and size of the "laminate voids" and "pink rings" has become one of the most popular and important topics in the field of the production of printed circuit boards and multilayer printed wiring boards.

Accordingly, a novel method of bonding copper and resin which mitigates and/or obviates the above-mentioned drawbacks is provided.

SUMMARY OF THE INVENTION

It is therefore a primary object of the present invention to provide a method of bonding copper and a resin together which provides a good resistance to acids as well as a sufficiently high bonding strength, and to particularly provide a method of bonding copper and a resin together in which the product is suitable for lamination in the production of multilayer printed wiring boards with reduced formation of pink rings and laminate voids.

In order to attain the above-mentioned object, the method of bonding copper and a resin together according to the present invention comprises a step of forming a regular hair-like morphology of a copper oxide layer on the surface of copper by oxidation of copper; a step of reducing the formed regular hair-like copper oxide layer to regular hair-like morphology of metallic copper with a reducing solution of controlled concentration and controlled pH at a controlled temperature under a well-circulated condition within a controlled period of reaction time to modify the morphology thereof; a step of forming a thin and even layer of copper oxide on the surface of the regular hair-like metallic copper with particular baking so as to work as an interface of bonding a metallic copper and a resin; and a step of bonding the surface of the above-mentioned copper oxide formed by the baking and a resin together by, for example, heat-pressing thereof.

DETAILED DESCRIPTION OF THE PREFERRED EMBODIMENT

Figure 1:
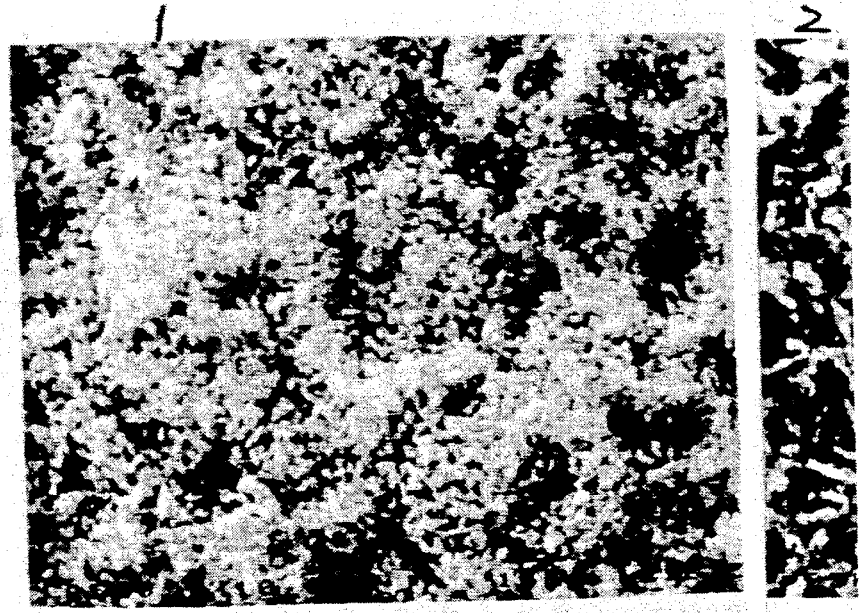
FIG. 1 is a photograph showing the surface morphology of an untreated printed circuit board or multilayer printed wiring board.

A method according to the present invention for bonding copper and resin comprises a step of forming a regular hair-like morphology of a copper oxide layer on the surface of copper by oxidation of copper; a step of reducing the formed regular hair-like copper oxide layer to regular hair-like morphology of metallic copper with a reducing solution of controlled concentration and controlled pH at a controlled temperature under a well-circulated condition within a controlled period of reaction time to modify the morphology thereof; a step of forming a thin and even layer of copper oxide on the surface of the regular hair-like metallic copper with particular baking so as to work as an interface of bonding a metallic copper and a resin; and a step of bonding the surface of the above-mentioned copper oxide formed by the baking and a resin together by, for example, heat-pressing thereof.

The step of forming a copper oxide layer on the even surface of copper by oxidation of copper is known in the art and thus details concerning this step require no further description.

The step of reducing the formed copper oxide layer to metallic copper should be carried out in a reducing solution of controlled concentration and controlled pH at a controlled temperature under a well-circulated condition within a controlled period of reaction time.

For the purpose of the present invention, the reducing solution mainly contains a reducing agent of formaldehyde By adequately adding alkaline solution and a stabilizer, the reducing agent of formaldehyde can reduce the copper oxide to metallic copper.

For the purpose of the present invention, the concentration of the added formaldehyde is maintained in a range between about 2% and 30%.

For the purpose of the present invention, the added alkaline solution may be a KOH or NaOH solution with a concentration thereof maintained in a range between 1% and 20%.

For the purpose of the present invention, the added stabilizer may be an alcohol (ROH) or an organic carboxylic acid (RCOOH) so as to stabilize and expedite the reducing reaction. The R substituent of the alcohol (ROH) or the organic carboxylic acid (RCOOH) is an alkyl group of $C_{1-4}$, phenyl, or derivatives thereof. An added amount of the stabilizer is in a range between about 0.1% and 1.5%.

For the purpose of the present invention, the temperature of the reducing solution should be kept constant in a range between about 35° C. and 60° C.

For the purpose of the present invention, the reducing solution is subjected to circulation in order to prevent the localization of the reaction during the process of reduction.

One of the characteristics of the present invention is the self-control effect. That is, the reduction reaction will automatically stop after the reduction reaction is completed. Usually, the reaction time is in a range between about one minute and 20 minutes depending on the thickness of the copper oxide.

During operation, the printed circuit board formed with copper oxide (either black oxide or brown oxide) is dipped vertically in the reducing solution containing the above-mentioned reducing agent at a constant temperature of about 35° C. to 60° C. under a circulated condition for about one minute to 20 minutes depending on the degree of reduction; meanwhile, a great amount of $CO_2$ and $H_2$ gas is produced.

After the step of reduction, the treated board formed with metallic copper layer is washed with clean water, dried, and baked. The temperature of baking is maintained in a range of about 100° C. to 150° C. for about minutes to four hours. After the step of baking, the treated board formed with thin copper oxide layer is subjected to the step of bonding the surface of the copper oxide and the resin.

The step of bonding the surface of the above-mentioned copper oxide layer formed by the step of baking and a resin together can be carried out by heat-pressing, which is known in the art and requires no further description.

Figure 2:
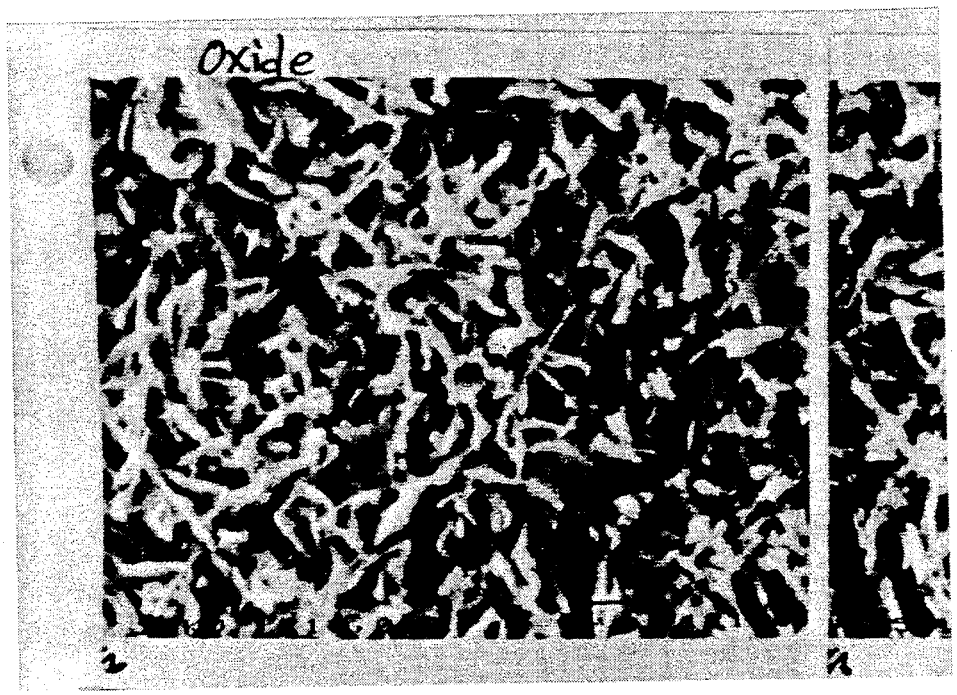
FIG. 2 is a photograph showing the surface morphology of an oxidized printed circuit board or multilayer printed wiring board.

It is noted that the untreated surface of the printed circuit boards or multilayer printed wiring boards is even, as shown in FIG. 1; however, after the step of oxidation, the even surface is formed to a hair-like morphology of copper oxide layer, as shown in FIG. 2. The effective surface area of the hair-like morphology of the copper oxide layer is increased dramatically. This characteristic of increasing surface area still remains after the steps of reducing reaction and baking, which can be seen in FIG. 3. The increased surface area will enhance the contact area between the copper board and a resin so as to increase the bonding strength between the copper board and a resin.

The following table shows the effectiveness of the present invention compared with the untreated copper board, the copper board after oxidation, and the copper board after oxidation and reduction.

TABLE

| | peel strength (lb/in) |
|---|---|
| untreated copper board | 0.02–0.05 |
| the board after oxidation | 0.8–1.0 |
| the oxidized board after reduction | 7.0–8.0 |
| the board according to the present invention | 7.0–8.0 |

Figure 3:
FIG. 3 is a photograph showing the surface morphology of an oxidized printed circuit board or multilayer printed wiring board after reducing and baking treatments.
Figure 5:
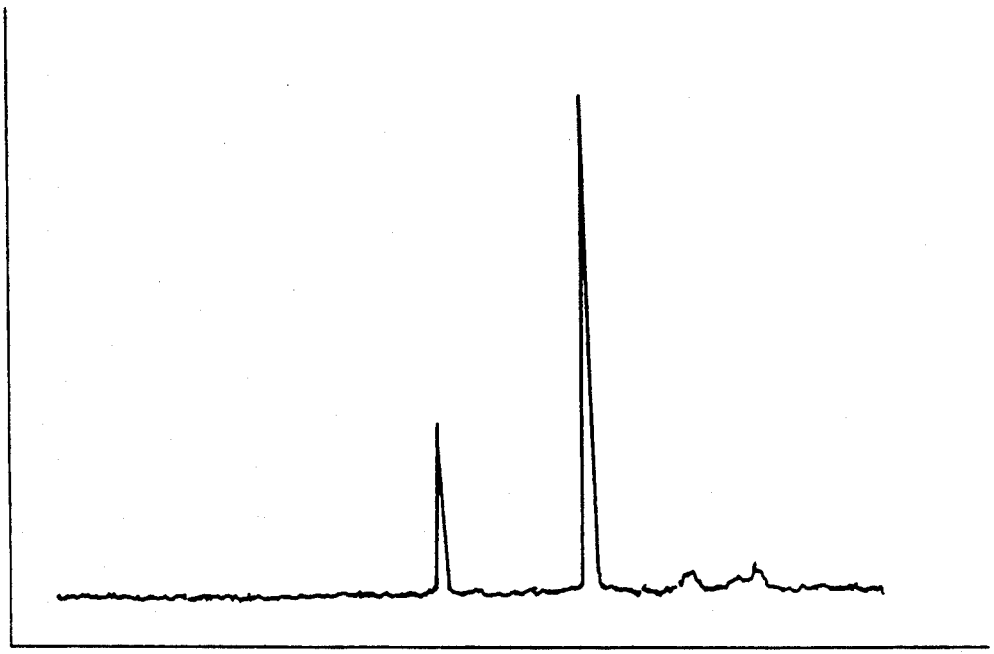
FIG. 5 is an X-ray diffraction spectrum of a printed circuit board or multilayer printed wiring board in accordance with the present invention.
Figure 6:
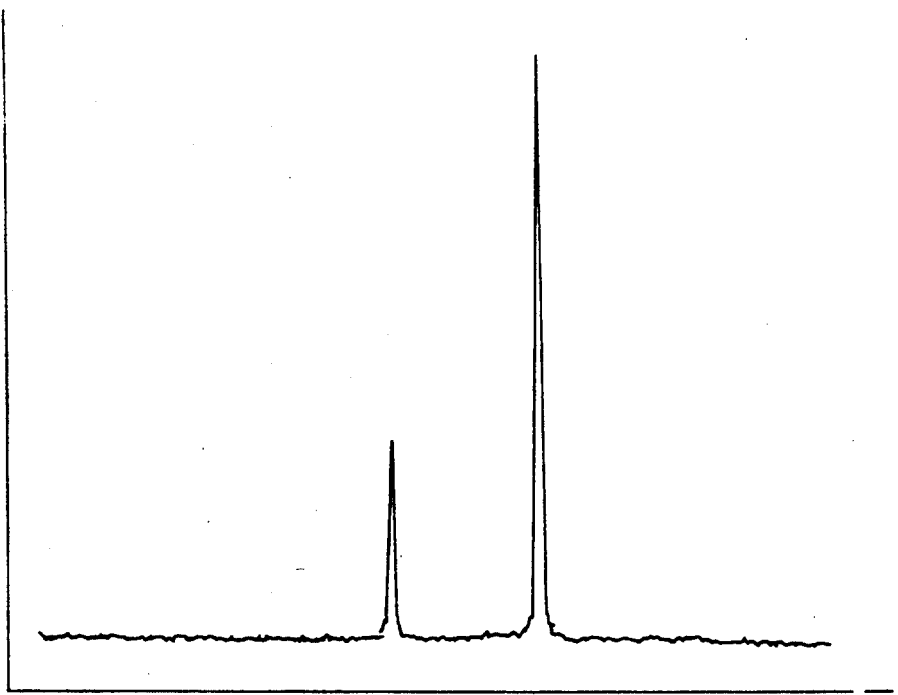
FIG. 6 is an X-ray diffraction spectrum of an untreated printed circuit board or multilayer printed wiring board.

From the X-ray diffraction spectrum of FIGS. 5 and 6 and the SEM photographs of FIGS. 1 to 3, it is noted that the copper surface of printed circuit boards or multilayer printed wiring boards is originally even but subsequently forms a hair-like morphology of copper oxide layer, a hair-like morphology of metallic copper layer, and a thin layer oxide formed on the surface of the hair-like morphology of metallic copper layer according to the present invention. The peel strength between the copper board and a resin changes from 0.02 lb/in to 8.0 lb/in. It is obvious that the present invention has dramatically increased the peel strength between the copper board and a resin by 400 times. Thus, the formation of laminate voids can be significantly reduced.

In the test of resisting aqueous acid, it can be found that the copper oxide formed on the even surface of the printed circuit boards or multilayer printed wiring boards is completely dissolved in about 8 to 12 seconds upon contact with an aqueous acid containing 10% HCl. However, the product according to the present invention can endure more than a hour upon contact with the aqueous acid containing 10% HCl. Therefore, in the production of printed circuit boards or multilayer printed wiring boards, the product according to the present invention will not be eroded upon contact with an aqueous acid and will diminish the drawbacks of "pink ring", that is, the exposure of the underlying copper metal which is pink in color.

Figure 4:
FIG. 4 is a photograph showing the surface morphology of an untreated printed circuit board or multilayer printed wiring board in accordance with the present invention after immersion in an aqueous acid containing HCL.

FIG. 4 shows the morphology of the copper oxide layer formed on the surface of the hair-like morphology of the metallic copper after immersion in an aqueous acid containing HCl. It can be found that the hair-like morphology is still maintained.

In the present invention, it has been discovered that the thin copper oxide layer formed on the surface of the hair-like morphology of the metallic copper layer is regular. When the resin is pressed onto the thin copper oxide layer, the resin layer can completely cover each hair of the copper oxide layer. Thus, the formation of pink ring can be significantly reduced.

It is observed that the printed circuit board produced by the method of this invention possesses the following improved qualities:

1) The number of laminate voids on the board is reduced from the original 30% to 60% to less than 0.2%.

2) The size of laminate voids is reduced from the original size of 3 to 5 mils to less than 1 mil in radius.

3) The size of pink rings is reduced from the original size of 11 to 14 mils to 1 to 2 mils in radius.

Additionally, it is appreciated that the present invention possesses the characteristics of less restriction in operation, simple set-up, no overreaction, easy control in production, and not being affected by the quality of the product from the preceding procedure.

While the present invention has been explained in relation to its preferred embodiment, it is to be understood that various modifications thereof will be apparent to those skilled in the art upon reading this specification. Therefore, it is to be understood that the invention disclosed herein is intended to cover all such modifications as fall within the scope of the appended claims.

I claim:

1. A method of bonding copper and resin comprising the steps of:
    a) forming a layer of copper oxide on a surface of copper by oxidation of copper;
    b) reducing said layer of copper oxide thus formed to metallic copper with a reducing solution of a controlled concentration at a controlled temperature under a well-circulated condition within a controlled period of reaction time to modify the morphology thereof;
    c) forming a layer of copper oxide on the surface of said metallic copper by baking; and
    d) bonding the surface of said copper oxide formed by baking and a resin together by heat-pressing, whereby a copper board is formed.

2. A process as claimed in claim 1, wherein said reducing solution contains formaldehyde.

3. A process as claimed in claim 2, wherein the concentration of formaldehyde is maintained in a range between about 2% to 30%.

4. A process as claimed in claim 2, wherein to said reducing solution is further added an alkaline solution and a stabilizer.

5. A process as claimed in claim 4, wherein said alkaline solution is a KOH or NaOH solution.

6. A process as claimed in claim 4, wherein said stabilizer is an alcohol (ROH) or an organic carboxylic acid (RCOOH).

7. A process as claimed in claim 5, wherein the concentration of said KOH or NaOH solution is maintained in a range between 1.0% and 20%.

8. A process as claimed in claim 6, wherein said R substituent of said alcohol (ROH) or said organic carboxylic acid (RCOOH) is an alkyl group of $C_{1-4}$, a phenyl group, or derivatives thereof.

9. A process as claimed in claim 6, wherein the concentration of said stabilizer is maintained in a range between about 0.1% and 15%.

10. A process as claimed in claim 1, wherein the temperature of said reducing solution is kept constant in a range between about 35° C. and 60° C.

11. A process as claimed in claim 1, wherein said reducing solution is subjected to full circulation.

12. A process as claimed in claim 1, wherein said period of reaction time of said copper oxide and said reducing solution is controlled such that all said copper oxide is reduced to metallic copper.

13. A process as claimed in claim 12, wherein said period of reaction time is in a range between about one minute and 20 minutes depending on the completeness of said reduction.

14. A process as claimed in claim 1, wherein said copper formed with said copper oxide is dipped vertically in said reducing solution.

15. A process as claimed in claim 1, wherein a device for filtering said reducing solution under circulation is installed therein.

16. A process as claimed in claim 1, wherein after said reducing step said metallic copper is washed with clean water and dried.

17. A process as claimed in claim 1, wherein the temperature of said baking is kept in a range between 100° C. and 150° C.

18. A process as claimed in claim 17, wherein the baking time is in a range between about 30 minutes and four hours.

19. A method of bonding copper and resin comprising the steps of:
    a) forming a layer of copper oxide on a surface of copper by oxidation of copper;
    b) reducing said layer of copper oxide thus formed to metallic copper with a reducing solution containing formaldehyde at a concentration between about 2% and 30% with the addition of a KOH of NaOH solution at a concentration between about 1.0% and 20% and a stabilizer selection from a group consisting of an alcohol (ROH) and an organic carboxylic acid (RCOOH), wherein said R substituent is an alkyl group of $C_{1-4}$, a phenyl group, or derivatives thereof at a concentration between about 0.1% and 15% by vertically dipping the copper board formed with copper oxide in said reducing solution isothermally at about 35° C. to 60° C. while being circulated for about one minute to 20 minutes, wherein a device for filter circulation is installed within said reducing solution, said copper board being washed with clean water and dried;

c) forming a layer of copper oxide on the surface of said metallic copper by baking; and
d) bonding the surface of said copper oxide formed by said baking and a resin together by heat-pressing.

* * * * *